US008277723B2

(12) United States Patent
Shindo

(10) Patent No.: US 8,277,723 B2
(45) Date of Patent: Oct. 2, 2012

(54) HIGH-PURITY HAFNIUM, TARGET AND THIN FILM COMPRISING HIGH-PURITY HAFNIUM, AND PROCESS FOR PRODUCING HIGH-PURITY HAFNIUM

(75) Inventor: Yuichiro Shindo, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 503 days.

(21) Appl. No.: 11/994,167

(22) PCT Filed: Jun. 12, 2006

(86) PCT No.: PCT/JP2006/311722
§ 371 (c)(1),
(2), (4) Date: Dec. 28, 2007

(87) PCT Pub. No.: WO2007/007498
PCT Pub. Date: Jan. 18, 2007

(65) Prior Publication Data
US 2009/0226341 A1 Sep. 10, 2009

(30) Foreign Application Priority Data

Jul. 7, 2005 (JP) ................................. 2005-198901

(51) Int. Cl.
C22C 27/00 (2006.01)
C23C 14/34 (2006.01)
C25C 5/00 (2006.01)
(52) U.S. Cl. ................... 420/422; 204/298.13; 205/560; 420/423
(58) Field of Classification Search ................. 420/422, 420/423; 204/298.13; 205/560
See application file for complete search history.

(56) References Cited

U.S. PATENT DOCUMENTS

| | | | |
|---|---|---|---|
| 2,782,116 A | 2/1957 | Spedding et al. |
| 4,637,831 A | 1/1987 | Stoltz et al. |
| 4,668,287 A | 5/1987 | Kwon |
| 4,897,116 A | 1/1990 | Scheel |
| 5,112,493 A | 5/1992 | Snyder et al. |
| 5,196,916 A | 3/1993 | Ishigami et al. |
| 5,458,697 A | 10/1995 | Ishigami et al. |
| 5,460,793 A | 10/1995 | Kano et al. |
| 5,679,983 A | 10/1997 | Ishigami et al. |
| 6,352,628 B2 | 3/2002 | Sato et al. |
| 6,723,183 B2 | 4/2004 | Oda et al. |
| 6,737,030 B2 | 5/2004 | Sommers et al. |
| 6,861,030 B2 | 3/2005 | Shindo |
| 6,986,834 B2 | 1/2006 | Irumata et al. |
| 7,241,368 B2 | 7/2007 | Irumata et al. |
| 7,674,441 B2 | 3/2010 | Shindo |
| 7,964,070 B2 | 6/2011 | Shindo |

| | | | |
|---|---|---|---|
| 2002/0194953 A1 | 12/2002 | Rosenberg et al. |
| 2003/0052000 A1 | 3/2003 | Segal et al. |
| 2003/0062261 A1 | 4/2003 | Shindo |
| 2004/0170552 A1 | 9/2004 | Irumata et al. |
| 2006/0062910 A1 | 3/2006 | Meiere |
| 2006/0189164 A1 | 8/2006 | Okabe et al. |
| 2006/0193979 A1 | 8/2006 | Meiere et al. |
| 2006/0266158 A1 | 11/2006 | Shindo |
| 2007/0018138 A1* | 1/2007 | Shindo ........................ 252/500 |
| 2009/0000704 A1 | 1/2009 | Okabe et al. |
| 2009/0126529 A1 | 5/2009 | Shindo |

FOREIGN PATENT DOCUMENTS

| | | |
|---|---|---|
| EP | 0134643 A2 | 3/1985 |
| EP | 0154448 A2 | 9/1985 |
| JP | 2002-089444 A | 3/2002 |
| JP | 2005045166 A * | 2/2005 |
| JP | 2006-037133 A | 2/2006 |
| WO | 2005/010220 A1 | 2/2005 |
| WO | WO 2005010220 A1 * | 2/2005 |
| WO | WO 2005049882 A1 * | 6/2005 |

OTHER PUBLICATIONS

R.H. Nielson, "Hafnium and Hafnium Compounds", Kirk-Othmer Encyclopedia of Chemical Technology, John Wiley & Sons, Inc., vol. 13, pp. 78-97, Jun. 18, 2004.
R.H. Nielson, "Hafnium and Hafnium Compounds", Ullmann's Encyclopedia of Industrial Chemistry, Wiley-VCH Verlag GmbH & Co., pp. 1-12, Jun. 15, 2000.
G.T. Murray, "Preparation and Characterization of Pure Metals", ASM Handbook, Formerly Tenth Edition, Metals Handbook, vol. 2, pp. 1093-1097, Oct. 1990.
ESP@CENET Database, English Abstract of JP 07-316681, Dec. 5, 1995.
ESP@CENET Database, English Abstract of JP 10-204554, Aug. 4, 1998.
ESP@CENET Database, English Abstract of JP 61-242993, Oct. 29, 1986.
Rolsten, "Iodide Metals and Metal Iodides", The Electrochemical Society, Inc., John Wiley & Sons, Inc., pp. 74-77, 1961 (month unknown).

\* cited by examiner (Continued)

Primary Examiner — Jessica L Ward
Assistant Examiner — Alexander Polyansky
(74) Attorney, Agent, or Firm — Howson & Howson LLP

(57) ABSTRACT

Provided is a method of manufacturing high-purity hafnium by using a hafnium sponge with reduced zirconium as the raw material in which the impurity content of Fe, Cr, and Ni, the impurity content of Ca, Na, and K, the impurity content of Al, Co, Cu, Ti, W, and Zn, the alpha dose, the impurity content of U and Th, the impurity content of Pb and Bi, and the content of C as a gas component contained in the hafnium are reduced. Based on this efficient and stable manufacturing technology, additionally provided are a high-purity hafnium material obtained from the foregoing high-purity hafnium, as well as a sputtering target, a gate insulation film and a metal gate thin film, which are formed from this material. This high-purity hafnium has a purity 6N or higher except Zr and gas components, wherein Fe, Cr and Ni are respectively 0.2 ppm or less, Ca, Na and K are respectively 0.1 ppm or less, and Al, Co, Cu, Ti, W and Zn are respectively 0.1 ppm or less.

15 Claims, No Drawings

HIGH-PURITY HAFNIUM, TARGET AND THIN FILM COMPRISING HIGH-PURITY HAFNIUM, AND PROCESS FOR PRODUCING HIGH-PURITY HAFNIUM

BACKGROUND OF THE INVENTION

The present invention relates to a high-purity hafnium material in which the impurity content of Fe, Cr, and Ni, the impurity content of Ca, Na, and K, the impurity content of Al, Co, Cu, Ti, W, and Zn, as well as the alpha dose, the impurity content of U and Th, the impurity content of Pb and Bi, and the content of C as a gas component contained in the hafnium are reduced, as well as to a sputtering target, a gate insulation film and a metal gate thin film, which are formed from such high-purity hafnium material. It also relates to a manufacturing method of high-purity hafnium.

Conventionally, there are numerous documents relating to the manufacture of hafnium. Hafnium is superior in heat resistance and corrosion resistance, and is characterized in that it has a strong affinity with oxygen and nitrogen. In addition, since the oxides or nitrides thereof have superior stability in high temperatures, they are utilized as fire-resistant materials in the manufacture of nuclear ceramics, steels or castings. Further, recently, these are also being used as electronic materials or optical materials.

The manufacturing method of metal hafnium is proposed to be the same as that of metal zirconium. As such examples, there are a method of reacting a fluorine-containing zirconium or hafnium compound with metal aluminum or magnesium in inert gas, reducing gas or a vacuum at a temperature of 400° C. or higher (e.g., refer to Patent Document 1), a manufacturing method commonly adopted in the sealing metals, wherein metals are respectively manufactured by reducing zirconium chloride, hafnium chloride or titanium chloride (e.g., refer to Patent Document 2); a manufacturing method of hafnium or zirconium characterized in the reaction vessel structure upon reducing zirconium tetrachloride or hafnium tetrachloride with magnesium and the manufacturing technique thereof (e.g., refer to Patent Document 3); a method of manufacturing chloro-, bromo- or iodic zirconium, hafnium, tantalum, vanadium and niobium compound with sublimation pressure by introducing these elements into a crucible (e.g., refer to Patent Document 4); a method of refining zirconium or hafnium chloride or an acid chloride aqueous solution with strongly basic anion exchange resin (e.g., refer to Patent Document 5); a method of collecting zirconium via solvent extraction (e.g., refer to Patent Document 6); and a crystal bar hafnium manufacturing device having characteristics in the feed portion (e.g., refer to Patent Document 7).

[Patent Document 1] Japanese Patent Laid-Open Publication No. S60-17027
[Patent Document 2] Japanese Patent Laid-Open Publication No. S61-279641
[Patent Document 3] Japanese Patent Laid-Open Publication No. S62-103328
[Patent Document 4] National Publication of Translated Version H3-501630 (WO89/11449)
[Patent Document 5] Japanese Patent Laid-Open Publication No. H10-204554
[Patent Document 6] Japanese Patent Laid-Open Publication No. S60-255621
[Patent Document 7] Japanese Patent Laid-Open Publication No. S61-242993

As described in the foregoing documents, there are numerous refining methods and extraction methods of hafnium. In recent years, deposition on electronic components using hafnium silicide is being demanded. In particular, usage as a gate insulation film or a metal gate film is being considered. Since these films are located immediately on the Si substrate, the influence of purity is significant. Contamination on the semiconductor substrate is particularly a problem.

Nevertheless, there had been a problem that significant amounts of zirconium are contained in hafnium, and the high purification of hafnium could not have been achieved easily. In addition, when hafnium as an electronic material was used as a gate insulation film or a metal gate film to be disposed in the vicinity of a silicon substrate, since there was no knowledge of what kind of behavior (adverse effect) the impurities contained in hafnium would yield, a problem is that the inclusion of impurities in hafnium has been tacitly accepted.

This is primarily attributed to the fact that the use of hafnium as an electronic component material such as a gate insulation film or a metal gate film is based on very recent technology.

SUMMARY OF THE INVENTION

An object of the present invention is to provide is a method of manufacturing high-purity hafnium by using a hafnium sponge with reduced zirconium as the raw material in which the impurity content of Fe, Cr, and Ni, the impurity content of Ca, Na, and K, the impurity content of Al, Co, Cu, Ti, W, and Zn, as well as the alpha dose, the impurity content of U and Th, the impurity content of Pb and Bi, and the content of C as a gas component contained in the hafnium are reduced. Based on this efficient and stable manufacturing technology, another object of the present invention is to provide a high-purity hafnium material obtained from the foregoing high-purity hafnium, as well as a sputtering target, a gate insulation film and a metal gate thin film, which are formed from this material.

In order to achieve the foregoing objects, as a result of intense study conducted by the present inventors, it enables to provide high-purity hafnium having a purity of 6N or higher except Zr and gas components. This high-purity hafnium possesses superior characteristics as an electronic material to be disposed in the vicinity of a silicon substrate without deteriorating or disrupting the functions of the electronic device, and as a material for forming a gate insulation film or a metal gate thin film. The impurities contained in the high-purity hafnium are as follows: Fe, Cr and Ni are respectively 0.2 ppm or less, Ca, Na and K are respectively 0.1 ppm or less, and Al, Co, Cu, Ti, W and Zn are respectively 0.1 ppm or less. Incidentally, all indications of purity (%, ppm, ppb) in this specification are based on weight (wt %, wtppm, wtppb).

The reason why Zr contained as impurities in hafnium is excluded is because, since Zr itself has similar chemical characteristics as hafnium, it is extremely difficult to eliminate Zr during the manufacture of high-purity hafnium from a technical perspective, and, since hafnium and Zr have similar characteristics, the inclusion of Zr as an impurity will not significantly change the characteristics. Although the inclusion of certain amounts of Zr is tacitly accepted due to the foregoing reasons, it goes without saying that it is desirable to eliminate Zr as much as possible when attempting to improve the characteristics of hafnium.

In addition, with the high-purity hafnium having a purity of 6N or higher except Zr and gas components according to the present invention, it is desirable that the alpha dose is 0.01 $cph/cm^2$ or less, U and Th are respectively less than 1 ppb, and Pb and Bi are respectively less than 0.1 ppm. The present invention also covers the high-purity hafnium with such reduced alpha dose, U and Th content, and Pb and Bi content.

Moreover, with the high-purity hafnium having a purity of 6N or higher except Zr and gas components according to the present invention, it is desirable that the content of C as a gas component is 50 ppm or less, and the present invention also covers the high-purity hafnium with such reduced C content.

When forming a thin film of an electronic material such as a gate insulation film or a metal gate thin film, the sputtering method is often performed, and this method is superior as a means for forming a thin film. Thus, the high-purity hafnium having a purity of 6N or higher except Zr and gas components can be formed as is into a high-purity hafnium target material.

The sputtering target formed from the high-purity hafnium of the present invention is able to form a gate insulation film or a metal gate thin film having a purity of 6N or higher except Zr and gas components, since the high purity of the material is reflected as is on the deposited thin film by being sputtered.

In addition, the foregoing impurities contained in the target, the gate insulation film and the metal gate thin film, which have a purity of 6N or higher, are of the same content as the foregoing impurities Fe, Cr and Ni, impurities Ca, Na and K, impurities Al, Co, Cu, Ti, W and Zn, alpha dose, impurities U and Th, impurities Pb and Bi, and C as a gas component. The present invention covers all of the above.

Upon manufacturing high-purity hafnium having a purity of 6N or higher except Zr and gas component, coarse $HfCl_4$ is firstly distilled and refined, and the refined $HfCl_4$ is reduced to obtain a hafnium sponge. Subsequently, molten salt electrolysis is performed with the hafnium sponge as the anode, and an electrodeposit is obtained through electrolysis. In addition, the electrodeposit is subject to electron beam melting so as to obtain high-purity hafnium having a purity of 6N or higher except Zr and gas components.

With the obtained high-purity hafnium having a purity of 6N or higher except Zr and gas components, it enables to reduce the foregoing impurities Fe, Cr and Ni respectively to 0.2 ppm or less, the impurities Ca, Na and K respectively to 0.1 ppm or less, the impurities Al, Co, Cu, Ti, W and Zn respectively to 0.1 ppm or less, the alpha dose to 0.01 $cph/cm^2$ or less, the impurities U and Th respectively to less than 1 ppb, the impurities Pb and Bi respectively to less than 0.1 ppm, and the content of C as a gas component to 50 ppm or less.

Alkali metals or alkali earth metals such as Ca, Na and K as impurities are highly mobile elements and easily move in the device. Thus, it is desirable that these elements are eliminated as much as possible in order to stabilize the characteristics of the device. Moreover, transition metals and heavy metals such as Fe, Cr, Ni, Al, Co, Cu, Ti, W and Zn as impurities will induce an increase in leak current and cause deterioration in the pressure resistance, and it is desirable that these elements are also eliminated as much as possible. Impurities U, Th, Pb and Bi cause soft errors of the accumulated electrical charge in the memory cell being inverted. Thus, in addition to reducing the content of these impurities, it is also necessary to control the alpha dose generated from these elements.

In addition, increase of the C content will cause the generation of particles during sputtering, and it is necessary to eliminate C as much as possible. Although the Zr content will not be a particular problem, it is preferably made to be 2500 ppm or less, and more preferably 1000 ppm or less.

Although the impurity content will vary depending on the amount of impurities contained in the raw material, by adopting the foregoing method, it is possible to adjust the respective impurities to be within the foregoing numerical values. The present invention provides the foregoing high-purity hafnium, a target and a thin film formed from such high-purity hafnium, and a manufacturing method of such high-purity hafnium.

With the high-purity hafnium having a purity of 6N or higher except Zr and gas components according to the present invention, foregoing impurities Fe, Cr and Ni are respectively 0.2 ppm or less, impurities Ca, Na and K are respectively 0.1 ppm or less, impurities Al, Co, Cu, Ti, W and Zn are respectively 0.1 ppm or less, alpha dose is 0.01 $cph/cm^2$ or less, impurities U and Th are respectively less than 1 ppb, impurities Pb and Bi are respectively less than 0.1 ppm, and the content of C as a gas component is 50 ppm or less. In particular, this high-purity hafnium possesses superior characteristics as an electronic material to be disposed in the vicinity of a silicon substrate without deteriorating or disrupting the functions of the electronic device, and as a material for forming a gate insulation film or a metal gate thin film.

Further, the manufacturing method according to the present invention yields an effect of being able to stably manufacture high-purity hafnium having a purity of 6N or higher except Zr and gas components.

DETAILED DESCRIPTION OF THE INVENTION

In the present invention, a hafnium sponge from which Zr has been eliminated is used as the raw material. Hafnium tetrachloride ($HfCl_4$) is used as the raw material. Commercially available hafnium tetrachloride can be used as the raw material. This commercially available hafnium tetrachloride contains roughly 5 wt % of Zr. Incidentally, hafnium (Hf) metal or hafnium oxide ($HfO_2$) may also be used as the raw material. These raw materials have a purity level of 3N except Zr, and contain Fe, Cr and Ni as primary impurities other than Zr.

First, this hafnium tetrachloride raw material is dissolved in purified water. Next, this is subject to multistage organic solvent extraction. Normally, solvent extraction is performed in 1 to 10 stages. TBP may be used as the organic solvent. As a result, Zr can be made to be 5000 wtppm or less.

Subsequently, neutralization treatment is performed to obtain hafnium oxide ($HfO_2$). This hafnium oxide is subject to chlorination to obtain high-purity hafnium tetrachloride ($HfCl_4$).

The foregoing process is known technology, and the present invention starts off from this high-purity hafnium tetrachloride ($HfCl_4$) raw material.

The $HfCl_4$ is distilled and refined. The obtained $HfCl_4$ is reduced with metal such as Mg having strong chloridization power to obtain a hafnium sponge having a purity level of 3N. With this hafnium sponge having a purity of 3N as the anode, electrodeposited hafnium is obtained by performing electrolysis at 700 to 1000° C. by means of an electrolytic bath of NaCl—KCl—$HfCl_4$ or the like. This electrodeposited hafnium is cleansed in purified water, and subject to light etching with fluoro-nitric acid.

The obtained electrodeposit is introduced in a Cu crucible and once subject to electron beam melting (hearth melting), and electrodeposited hafnium is sequentially placed therein. The hafnium molten metal overflows the pool into the upper part of the ingot. This is still in a molten metal state, and the purity can be improved by performing the two melting processes with a series of electronic beam operations at the stages of hearth melting and manufacturing the ingot.

Like this, it is possible to obtain a high-purity hafnium ingot having a purity of 6N (99.9999%) or higher except zirconium and gas components such as carbon, oxygen and nitrogen. Further, it is possible to use this high-purity hafnium to manufacture a high-purity hafnium target. As a result of measuring the alpha dose of the target by means of a gas flow counter measurement device, the alpha dose was 0.01 cph/cm² or less.

It is further possible to deposit high-purity hafnium on a substrate by performing sputtering with this high-purity target.

The target may be manufactured with the ordinary processing steps of forging, rolling, cutting, finishing (polishing) and so on. There is no particular limitation in the manufacturing method thereof, and the method may be selected arbitrarily.

EXAMPLES

Examples of the present invention are now explained. These Examples are merely illustrative, and the present invention shall in no way be limited thereby. In other words, the present invention includes the various modifications other than the Examples of this invention.

Example 1

Coarse HfCl₄ was distilled and refined at a temperature of roughly 320° C. The refined HfCl₄ was reduced with Mg metal having strong chloridation power to obtain a hafnium sponge having a purity of 3N. At the distilling and refining stage, the Zr impurity content decreased from a 5000 ppm level to an 800 ppm level.

With this hafnium sponge having a purity of 3N as the anode, electrolysis was performed at 720° C. by means of an electrolytic bath of NaCl—KCl—HfCl₄ to obtain electrodeposited hafnium. The electrodeposited hafnium was cleansed with purified water, and subject to light etching with fluoronitric acid. It was thereby possible to eliminate Fe, Cr, Ni, Al, Co, Cu, Ti, W, Zn, U, Th and C. In particular, the effect of decreasing W, C, U and Th was significant.

The obtained electrodeposit was introduced in a Cu crucible and once subject to electron beam melting (hearth melting), and electrodeposited hafnium was sequentially placed therein. The hafnium molten metal overflows the pool into the upper part of the ingot. This was still in a molten metal state, and the purity could be improved by performing the two melting processes with a series of electronic beam operations at the stages of hearth melting and manufacturing the ingot. It was thereby possible to effectively eliminate the foregoing impurities other than W, C, U and Th, as well as Ca, Na and K.

Like this, it was possible to obtain a high-purity hafnium ingot having a purity of 6N (99.9999%) or higher except zirconium. The chemical analytical values (GDMS analysis) of the top part (upper part) and bottom part (lower part) of the ingot are shown in Table 1.

The analytical values of respective impurities were as follows. Fe was less than 0.01 ppm, Cr was less than 0.01 ppm, Ni was 0.04 to 0.08 ppm, Ca was less than 0.01 ppm, Na was less than 0.01 ppm, K was less than 0.01 ppm, Al was less than 0.01 ppm, Co was less than 0.01 ppm, Cu was less than 0.05 ppm, Ti was less than 0.01 ppm, W was 0.01 ppm, Zn was less than 0.01 ppm, alpha dose was less than 0.004 cph/cm², U was less than 0.001 ppm, Th was less than 0.001 ppm, Pb was less than 0.01 ppm, Bi was less than 0.01 ppm, and the C content was 10 ppm.

These show the analytical values of the top part of the ingot. Although there was a slight different, the bottom part had basically the same impurity content. Both the top part and bottom part satisfied the conditions of the present invention. The sputtering target obtained from this ingot was also able to maintain the same level of high purity, and it was possible to form a high-purity hafnium thin film having uniform characteristics on a substrate by sputtering the foregoing target.

TABLE 1

| | Example 1 | | Example 2 (ppm) | |
|---|---|---|---|---|
| | TOP | BTM | TOP | BTM |
| Fe | <0.01 | <0.01 | 0.01 | 0.05 |
| Cr | <0.01 | <0.01 | <0.01 | <0.01 |
| Ni | 0.04 | 0.08 | 0.10 | 0.18 |
| Ca | <0.01 | <0.01 | <0.01 | <0.01 |
| Na | <0.01 | <0.01 | <0.01 | <0.01 |
| K | <0.01 | <0.01 | <0.01 | <0.01 |
| Al | <0.01 | <0.01 | <0.01 | <0.01 |
| Co | <0.01 | <0.01 | <0.01 | <0.01 |
| Cu | <0.05 | <0.05 | <0.05 | <0.05 |
| Ti | <0.01 | <0.01 | 0.03 | 0.05 |
| W | 0.01 | 0.01 | <0.01 | <0.01 |
| Zn | <0.01 | <0.01 | <0.01 | <0.01 |
| U | <0.001 | <0.001 | <0.001 | <0.001 |
| Th | <0.001 | <0.001 | <0.001 | <0.001 |
| Pb | <0.01 | <0.01 | <0.01 | <0.01 |
| Bi | <0.01 | <0.01 | <0.01 | <0.01 |
| C | 10 | 10 | 30 | 10 |
| Alpha Dose (cph/cm²) | <0.004 | <0.004 | 0.004 | 0.004 |

Example 2

As with Example 1, coarse HfCl₄ was distilled and refined at a temperature of roughly 320° C. The refined HfCl₄ was reduced with Mg metal having strong chloridation power to obtain a hafnium sponge having a purity of 3N. At this stage, the Zr impurity content decreased from a 5000 ppm level to an 800 ppm level. With this hafnium sponge having a purity of 3N as the anode, electrolysis was performed at 720° C. by means of an electrolytic bath of NaCl—KCl—HfCl₄ to obtain electrodeposited hafnium. The electrodeposited hafnium was cleansed with purified water, and subject to light etching with fluoro-nitric acid. It was thereby possible to eliminate Fe, Cr, Ni, Al, Co, Cu, Ti, W, Zn, U, Th and C. In particular, the effect of decreasing W, C, U and Th was significant.

The obtained electrodeposit was introduced in a Cu crucible and once subject to electron beam melting. Incidentally, the difference between Example 2 and Example 1 is that hearth melting was not performed in Example 2. This enabled to obtain a high-purity hafnium ingot having a purity of 6N (99.9999%) or higher except zirconium. The chemical analytical values (GDMS analysis) of the top (upper part) and bottom (lower part) of the ingot are similarly shown in Table 1.

The analytical values of respective impurities were as follows. Fe was 0.01 to 0.05 ppm, Cr was less than 0.01 ppm, Ni was 0.10 to 0.18 ppm, Ca was less than 0.01 ppm, Na was less than 0.01 ppm, K was less than 0.01 ppm, Al was less than 0.01 ppm, Co was less than 0.01 ppm, Cu was less than 0.05 ppm, Ti was 0.03 to 0.05 ppm, W was less than 0.01 ppm, Zn was less than 0.01 ppm, alpha dose was 0.004 cph/cm², U was less than 0.001 ppm, Th was less than 0.001 ppm, Pb was less than 0.01 ppm, Bi was less than 0.01 ppm, and the C content was 10 to 30 ppm.

These show the analytical values of the top part of the ingot. Although there was a slight different, the bottom part had basically the same impurity content. Both the top part and bottom part satisfied the conditions of the present invention. The sputtering target obtained from this ingot was also able to maintain the same level of high purity, and it was possible to form a high-purity hafnium thin film having uniform characteristics on a substrate by sputtering the foregoing target.

With the high-purity hafnium having a purity of 6N or higher except Zr and gas components according to the present invention, foregoing impurities Fe, Cr and Ni are respectively 0.2 ppm or less, impurities Ca, Na and K are respectively 0.1 ppm or less, impurities Al, Co, Cu, Ti, W and Zn are respectively 0.1 ppm or less, alpha dose is 0.01 cph/cm$^2$ or less, impurities U and Th are respectively less than 1 ppb, impurities Pb and Bi are respectively less than 0.1 ppm, and the content of C as a gas component is 50 ppm or less. In particular, this high-purity hafnium possesses superior characteristics as an electronic material to be disposed in the vicinity of a silicon substrate without deteriorating or disrupting the functions of the electronic device, and as a material for forming a gate insulation film or a metal gate thin film.

The invention claimed is:

1. High-purity hafnium having a purity of 6N or higher excluding Zr and gas components and total impurities excluding Zr and gas components of 1 ppm or less, wherein Fe content is 0.01 to 0.05 ppm, Cr and Ni are respectively 0.2 ppm or less, Ca, Na and K are respectively 0.1 ppm or less, Al, Co, Cu, Ti, W and Zn are respectively 0.1 ppm or less, U and Th are respectively less than 1 ppb, and Pb and Bi are respectively less than 0.1 ppm.

2. The high-purity hafnium according to claim 1, wherein the alpha dose is 0.01 cph/cm$^2$ or less.

3. The high-purity hafnium according to claim 2, wherein the content of C as a gas component is 50 ppm or less.

4. A sputtering target formed from the high-purity hafnium according to claim 1.

5. A gate insulation film or a metal gate thin film formed from the high-purity hafnium according to claim 1.

6. A manufacturing method of high-purity hafnium having a purity of 6N or higher excluding Zr and gas components awl total impurities excluding Zr and gas components of 1 ppm or less, and Fe content of 0.01 to 0.05 ppm, including the steps of distilling and refining coarse HfCl$_4$, reducing the refined HfCl$_4$ to obtain a hafnium sponge, performing molten salt electrolysis with the hafnium sponge as the anode, and subjecting an electrodeposit obtained through electrolysis to electron beam melting.

7. A high-purity hafnium according to claim 1, wherein the content of C as a gas component is 50 ppm or less.

8. A sputtering target, gate insulation film, or metal gate thin film formed from high-purity hafnium having a purity of 6N or higher excluding Zr and gas components and total impurities excluding Zr and gas components of 1 ppm or less, wherein Fe content is 0.01 to 0.05 ppm, Cr and Ni are respectively 0.2 ppm or less, Ca, Na and K are respectively 0.1 ppm or less, Al, Co, Cu, Ti, W and Zn are respectively 0.1 ppm or less, U and Th are respectively less than 1 ppb, and Pb and Bi are respectively less than 0.1 ppm.

9. A sputtering target, gate insulation film, or metal gate thin film according to claim 8, wherein the content of C as a gas component is 50 ppm or less.

10. A sputtering target, gate insulation film, or metal gate thin film according to claim 8, wherein alpha dose is 0.01 cph/cm$^2$ or less.

11. A sputtering target, gate insulation film, or metal gate thin film according to claim 10, wherein the content of C as a gas component is 50 ppm or less.

12. A sputtering target, gate insulation film, or metal gate thin film according to claim 11, wherein Ni content is 0.04 to 0.18 ppm.

13. A sputtering target, gate insulation film, or metal gate thin film according to claim 12, wherein Ti content is 0.05 ppm or less.

14. The high-purity hafnium according to claim 1, wherein Ni content is 0.04 to 0.18 ppm.

15. The high-purity hafnium according to claim 1, wherein Ti content is to 0.05 ppm or less.

\* \* \* \* \*

UNITED STATES PATENT AND TRADEMARK OFFICE
CERTIFICATE OF CORRECTION

PATENT NO. : 8,277,723 B2
APPLICATION NO. : 11/994167
DATED : October 2, 2012
INVENTOR(S) : Yuichiro Shindo It is certified that error appears in the above-identified patent and that said Letters Patent is hereby corrected as shown below:

Column 7, line 35 "components awl" should read "components,"

Column 8, line 35, "is to 0.05" should read "is 0.05"

Signed and Sealed this
Fifth Day of February, 2013

Teresa Stanek Rea
*Acting Director of the United States Patent and Trademark Office*